United States Patent
Matsuno et al.

(10) Patent No.: US 10,605,871 B2
(45) Date of Patent: Mar. 31, 2020

(54) METHOD AND DEVICE FOR DETERMINING STATE OF RECHARGEABLE BATTERY

(71) Applicants: PRIMEARTH EV ENERGY CO., LTD., Kosai-shi, Shizuoka (JP); TOYOTA JIDOSHA KABUSHIKI KAISHA, Toyota-shi, Aichi-ken (JP)

(72) Inventors: Hiroshi Matsuno, Toyohashi (JP); Shinichiro Ito, Kosai (JP); Yasushi Nakagiri, Kyotanabe (JP); Daisuke Koba, Toyohashi (JP); Tamotsu Fukuma, Kosai (JP); Junta Izumi, Nagoya (JP); Kazuya Kodama, Tajimi (JP); Masahiko Mitsui, Toyota (JP)

(73) Assignees: PRIMEARTH EV ENERGY CO., LTD., Kosai-Shi (JP); TOYOTA JIDOSHA KABUSHIKI KAISHA, Tokyo-Shi (JP)

( * ) Notice: Subject to any disclaimer, the term of this patent is extended or adjusted under 35 U.S.C. 154(b) by 70 days.

(21) Appl. No.: 16/124,028

(22) Filed: Sep. 6, 2018

(65) Prior Publication Data
US 2019/0079140 A1  Mar. 14, 2019

(30) Foreign Application Priority Data
Sep. 11, 2017 (JP) .................................. 2017-174061

(51) Int. Cl.
G01R 31/392 (2019.01)
H02J 7/00 (2006.01)
(Continued)

(52) U.S. Cl.
CPC ......... *G01R 31/392* (2019.01); *G01R 31/388* (2019.01); *H02J 7/0021* (2013.01);
(Continued)

(58) Field of Classification Search
CPC ................ G01R 31/392; G01R 31/388; G01R 31/3842; G01R 31/389; H02J 7/0069;
(Continued)

(56) References Cited

U.S. PATENT DOCUMENTS

2014/0218042 A1* 8/2014 Koba .................... G01R 31/389
324/430

FOREIGN PATENT DOCUMENTS

WO    2013/115038 A1    8/2013

* cited by examiner

*Primary Examiner* — Farhana A Hoque
(74) *Attorney, Agent, or Firm* — Maschoff Brennan

(57) ABSTRACT

A method for determining a state of a rechargeable battery includes obtaining a complex impedance measured by applying AC voltage or AC current to a rechargeable battery that is subject to determination and determining a state of the rechargeable battery based on the obtained complex impedance. The determining a state of the rechargeable battery includes determining whether or not a first capacity shift is occurring based on a comparison of a value of the complex impedance at a predetermined frequency with a first determination value used to determine a negative electrode capacity shift, and when determined that the first capacity shift is not occurring, determining whether or not a second capacity shift is occurring based on a comparison of a gradient of the complex impedance with respect to a real axis in a diffusion resistance region with a second determination value used to determine a positive electrode capacity shift.

15 Claims, 4 Drawing Sheets

(51) Int. Cl.
*H02J 7/14* (2006.01)
*G01R 31/388* (2019.01)

(52) U.S. Cl.
CPC .......... *H02J 7/0047* (2013.01); *H02J 7/0069* (2020.01); *H02J 7/14* (2013.01); *H02J 7/0048* (2020.01)

(58) Field of Classification Search
CPC .......... H02J 7/0047; H02J 7/14; H02J 7/0021; H02J 7/0048; H02J 2007/005; H02J 7/0075
USPC .................................. 324/426, 430; 307/104
See application file for complete search history.

Fig.3

```
START
  ↓
Pack disassembling step — S11
  ↓
Remainder discharging step — S12
  ↓
Deterioration mode determination and adjustment step — S13
  ↓
Pack assembling step — S14
  ↓
END
```

Fig.4

| Deterioration Mode | Determination Method | Deterioration | Adjustment Method |
|---|---|---|---|
| Negative Electrode Capacity Shift (H51) | Maximum Value of Imaginary Axis Component | High | Overcharge Electric Amount Large (H511) |
| | | Intermediate | Overcharge Electric Amount Small (H512) |
| | | Low | Adjustment Unnecessary (H513) |
| Positive Electrode Capacity Shift (H52) | Gradient of Diffusion Resistance | High | Overdischarge Electric Amount Large (H521) |
| | | Intermediate | Overdischarge Electric Amount Small (H522) |
| | | Low | Adjustment Unnecessary (H523) |

METHOD AND DEVICE FOR DETERMINING STATE OF RECHARGEABLE BATTERY

CROSS-REFERENCE TO RELATED APPLICATIONS

This application is based upon and claims the benefit of priority from prior Japanese Patent Application No. 2017-174061, filed on Sep. 11, 2017, the entire contents of which are incorporated herein by reference.

BACKGROUND ART

The present invention relates to a method and device for determining the state of a rechargeable battery.

Complex impedance analysis is performed to determine the state of a battery. This technique allows the battery state to be determined without destroying the battery. Thus, the battery can be reused when determined that the battery is normal.

International Patent Publication No. WO2013/115038 discloses one example of a determination device that determines the state of a rechargeable battery based on the complex impedance analysis.

The determination device described in International Patent Publication No. WO 2013/115038 applies AC voltage to a rechargeable battery while varying the frequency in steps. Further, the determination device obtains the gradient of two or more impedances measured at different frequencies in a diffusion region of the rechargeable battery. Then, the determination device compares the inclination angle with a threshold value. When the inclination angle is greater than or equal to the threshold value, the determination device determines that the capacity balance of the battery is normal. When the inclination angle is less than the threshold value, the determination device determines that the capacity balance of the battery is abnormal. Further, when the level of an imaginary axis of the complex impedance in the diffusion region of the rechargeable battery is greater than a threshold value, the determination device determines that the capacity balance of the battery is abnormal. When the level of the imaginary axis of the complex impedance is less than or equal to the threshold value, the determination device determines that the capacity balance of the battery is normal.

SUMMARY OF THE INVENTION

The number of hybrid vehicles and electric vehicles has increased over these recent years. This has increased the number of used rechargeable batteries that were mounted in such vehicles to serve as power sources. Rechargeable batteries that were used as vehicle power sources are often reused. Thus, when performing reuse-related processes, various conditions of a rechargeable battery that is subject to reuse need to be determined with further accuracy. Although International Patent Publication No. WO2013/115038 describes how to determine the discharge reserve of a used rechargeable battery, it is still difficult to determine other battery conditions.

In this manner, battery conditions other than the discharge reserve may have to be checked not only when determining whether or not a rechargeable battery can be reused but whenever there is a need to determine the state of a rechargeable battery.

One aspect of the present invention is a method for determining a state of a rechargeable battery. The method includes obtaining a complex impedance measured by applying AC voltage or AC current to a rechargeable battery that is subject to determination, and determining a state of the rechargeable battery based on the obtained complex impedance. The determining a state of the rechargeable battery includes determining whether or not a first capacity shift is occurring based on a comparison of a value of the complex impedance at a predetermined frequency with a first determination value used to determine a negative electrode capacity shift. Further, the determining a state of the rechargeable battery includes when determined that the first capacity shift is not occurring, determining whether or not a second capacity shift is occurring based on a comparison of a gradient of the complex impedance with respect to a real axis in a diffusion resistance region with a second determination value used to determine a positive electrode capacity shift.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a flowchart schematically showing the procedures of a determination method in the embodiment;

FIG. 4 is a chart illustrating deterioration modes determined in the embodiment, determination methods, and adjustment methods corresponding to the deterioration modes;

FIGS. 8A and 8B are schematic diagrams illustrating deterioration of a unit cell in the rechargeable battery determination device according to the present invention, in which FIG. 8A illustrates a state when a negative electrode capacity shift is occurring and FIG. 8B illustrates a state when a positive electrode capacity shift is occurring.

EMBODIMENTS OF THE INVENTION

One embodiment of a rechargeable battery condition determination device will now be described with reference to FIGS. 1 to 7.

The rechargeable battery condition determination device will now be briefly described.

Figure 1:
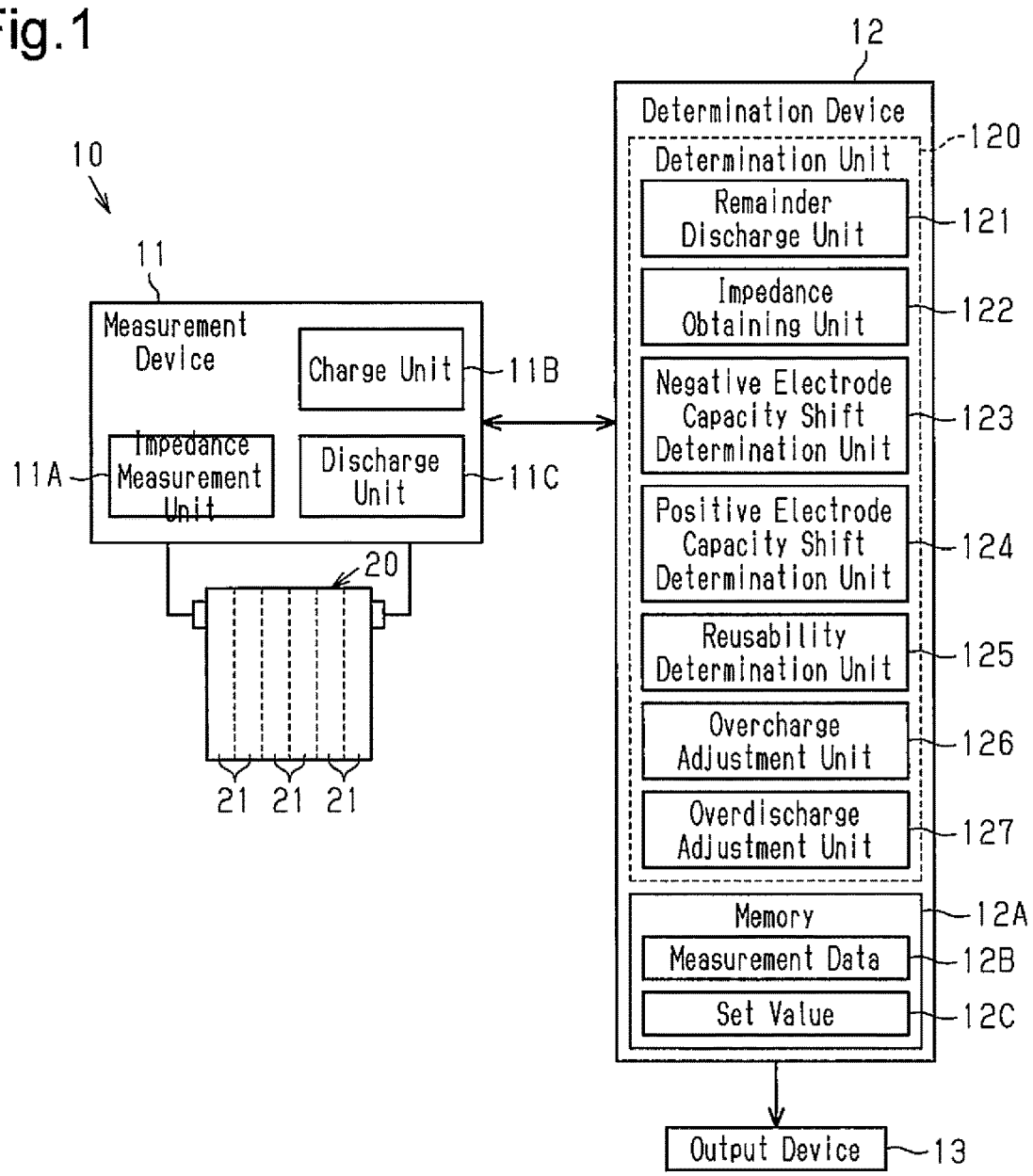
FIG. 1 is a schematic block diagram showing a rechargeable battery condition determination device according to one embodiment of the present invention.

Referring to FIG. 1, in the present embodiment, a battery unit will refer to a battery module 20 including a plurality of unit cells (battery cells 21), and a battery stack will refer to a stack of the battery modules 20. The battery module 20 may be a nickel-metal hydride rechargeable battery. The device determines whether or not there is a negative electrode capacity shift, or first capacity shift, occurring in the battery module 20, which is a used battery module available on the market and was installed in a vehicle, based on the value of the complex impedance at a predetermined frequency, particularly, the magnitude of an imaginary axis component in a diffusion resistance region. Further, the device determines whether or not the battery module 20 is in a state in which negative electrode capacity shift is occurring, in a state in which positive electrode capacity shift is occurring, or in a normal state in which neither negative electrode capacity shift nor positive electrode capacity are occurring. The prior art determines whether or not the battery module 20 is in a normal state or a deteriorated state but does not determine whether the deterioration is caused by a negative electrode capacity shift or a positive electrode capacity shift.

Figure 2:
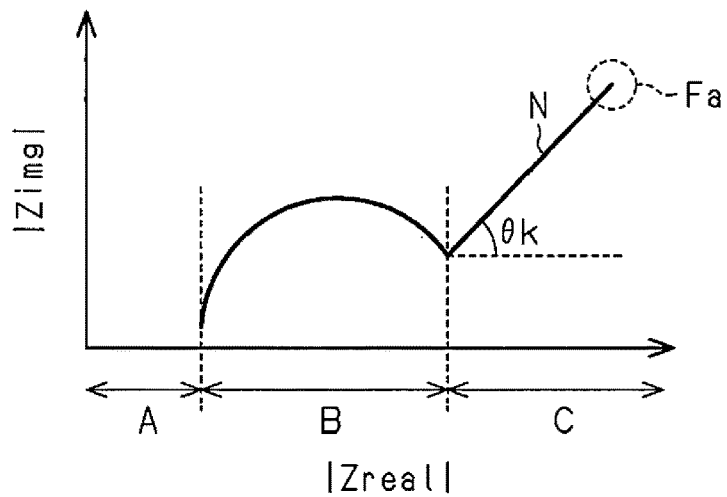
FIG. 2 is a graph showing the complex impedance obtained by the rechargeable battery condition determination device in accordance with the present invention.

With reference to FIG. 2, although the determination of whether or not the battery module 20 has deteriorated is based on the gradient θk of the complex impedance curve N with respect to the real axis in the diffusion resistance region C is known in the prior art, the cause of the deterioration was not determined. The inventors of the present invention have found that the reusability of the battery module 20 can be increased by reconditioning the battery module 20. For example, the inventors of the present invention have found that the reusability can be increased by performing overcharging reconditioning on the battery module 20 when the cause is a negative electrode capacity shift (e.g., refer to second cell in FIG. 6) and discharging reconditioning on the battery module 20 when the cause is a positive electrode capacity shift (e.g., refer to third cell in FIG. 7). Further, the inventors of the present invention have tested techniques that allow for determination of causes so that a reconditioning process can be performed if the battery module 20 is deteriorated. More specifically, the inventors of the present invention have tested techniques for determining whether or not the cause is a negative electrode capacity shift or a positive electrode capacity shift. As a result, the inventors of the present invention have found that the occurrence of a negative electrode capacity shift can be determined from the value Fa of the complex impedance curve N at a predetermined frequency. More preferably, the inventors of the present invention have found that a negative electrode capacity shift can be determined based on the value Fa of an imaginary axis component of the complex impedance curve N in the diffusion resistance region C at a predetermined frequency. Additionally, the inventors of the present invention have found that a positive electrode capacity shift can be determined based on the gradient θk of the complex impedance curve N with respect to the real axis in the diffusion resistance region C when a negative electrode capacity shift is not occurring.

Configuration

The configuration of a reuse processor 10 including a rechargeable battery condition determination device will now be described with reference to FIG. 1.

As shown in FIG. 1, the reuse processor 10 includes a measurement device 11 and a determination device 12 that serves as a rechargeable battery determination device.

The measurement device 11 includes an impedance measurement unit 11A, the discharge unit 11B, and a charge unit 11C. The impedance measurement unit 11A applies AC voltage or AC current to the battery module 20, which serves as the rechargeable battery that is subject to determination, to measure the complex impedance. The discharge unit 11B discharges electric power that is stored in the battery module 20. The charge unit 11C charges and stores electric power in the battery module 20. The measurement device 11 also includes a configuration for measuring the voltage across the terminals of the battery module 20 (OCV) and a configuration for measuring the battery resistance with respect to alternating current (AC-IR).

The battery module 20 includes the battery cells 21. A plurality of battery modules 20 are combined to form a battery stack (not shown). The battery stack, an ECU, and the like form a battery back (not shown) installed in a vehicle or the like.

The determination device 12 includes a determination unit 120 that executes calculation processing programs stored in a memory 12A to perform various types of processes such as the determination of a deteriorated condition of the rechargeable battery. The determination result of the determination device 12 is output to an output device 13 such as a display, a printer, or the like. The determination unit 120 may be configured by one or more exclusive circuits or one or more processors. For example, the determination unit 120 may include one or more processors and the memory 12A or the like (computer-readable non-transitory storage medium) storing one or more programs including a group of instructions that can be executed by the one or more processors. When executing the group of instructions, the processor performs the rechargeable battery condition determination method according to the present disclosure. For example, a program includes a group of instructions that has a processor execute steps S20 to S33 of a deterioration mode determination and adjustment step (step S13). Accordingly, the present disclosure presents a computer-readable non-transitory storage medium storing such a program.

The memory 12A stores a measurement frequency band and various threshold values determined and set through experiments for the battery module 20 subject to determination. The measurement frequency band and the various threshold values vary in accordance with the battery type, such as nickel-metal hydride battery and lithium battery, or, if the type of battery is the same, in accordance with the number of cells, the capacity, or the like. In this manner, when the type or configuration of the battery subject to determination changes, the measurement frequency band and the various determination values are set in accordance with the subject of determination. The measurement frequency band, the various determination threshold values, and the like are each held in the memory 12A as a set value 12C.

The determination unit 120 includes a remainder discharge unit 121, an impedance obtaining unit 122, a negative electrode capacity shift determination unit 123 serving as a first capacity shift determination unit, a positive electrode capacity shift determination unit 124 serving as a second capacity shift determination unit, and a reusability determination unit 125. The determination unit 120 includes an overcharge adjustment unit 126 that serves as an overcharge unit and an overdischarge adjustment unit 127 that serves as an overdischarge unit. In the present embodiment, the condition determination unit includes at least the negative electrode capacity shift determination unit 123, the positive electrode capacity shift determination unit 124, and the reusability determination unit 125.

The remainder discharge unit 121 sets a remaining capacity that is suitable for complex impedance measurement of the remaining capacity of the battery module 20. The remaining capacity of the battery module 20 may be referred to as the state of charge (SOC). The suitable remaining capacity is, for example, "0 Ah" and indicated as an SOC of "0%." The remainder discharge unit 121 outputs a discharge command to the discharge unit 11B of the measurement device 11. The remainder discharge unit 121 calculates at least one of the remaining capacity and the SOC from the discharge current or OCV of the battery module 20 and reflects the calculation result on the discharge instruction. Thus, the remainder discharge unit 121 discharges the battery module 20 to the suitable remaining capacity.

The impedance obtaining unit 122 instructs the impedance measurement unit 11A of the measurement device 11 to measure the impedance of the battery module 20 and obtains the measured impedance from the measurement device 11. The impedance obtaining unit 122 holds the obtained impedance as measurement data 12B in the memory 12A.

The negative electrode capacity shift determination unit 123 determines whether or not a negative electrode capacity shift is occurring based on the impedance of the battery module 20 held as the measurement data 12B. The negative electrode capacity shift is a relative positional shift of the positive electrode capacity and the negative electrode capacity in the battery cell 21 (e.g., second cell in FIG. 2). Further, the negative electrode capacity shift is also referred to as the negative electrode capacity balance because of the shift in the balance of the relative positions of the chargeable and dischargeable capacity range between the battery cells 21.

The positive electrode capacity shift determination unit 124 determines whether or not a positive electrode capacity shift is occurring based on the impedance of the battery module 20 held as the measurement data 12B. The positive electrode capacity shift is also referred to as the positive electrode capacity balance because of the shift in the balance of the relative positions of the chargeable and dischargeable capacity range between the battery cells 21 (for example, refer to third cell in FIG. 7).

The reusability determination unit 125 determines whether or not the battery module 20 is reusable based on the determination result of the negative electrode capacity shift determination unit 123 or the determination results of both of the negative electrode capacity shift determination unit 123 and the positive electrode capacity shift determination unit 124. The reusability determination distinguishes a reusable battery module 20 from a non-reusable battery module 20.

The overcharge adjustment unit 126 performs an overcharge adjustment and conducts a reconditioning process on the battery module 20. The overcharge adjustment reduces or eliminates negative electrode capacity shift of the battery module 20. For example, the overcharge adjustment unit 126 performs overcharge adjustment, or a reconditioning process, on a battery module 20 determined by the negative electrode capacity shift determination unit 123 as having a negative electrode capacity shift.

The overdischarge adjustment unit 127 performs an overdischarge adjustment and conducts a reconditioning process on the battery module 20. The overdischarge adjustment reduces or eliminates positive electrode capacity shift of the battery module 20. For example, the positive electrode capacity shift determination unit 124 performs overdischarge adjustment, or a reconditioning process, on a battery module 20 determined by the overdischarge adjustment unit 127 as having a positive electrode capacity shift.

Complex Impedance

The complex impedance Z of the battery module 20 measured by the measurement device 11 is expressed below by a real axis component Zreal, an imaginary axis component Zimg, and an imaginary axis unit j.

$$Z = Zreal + jZimg$$

In FIG. 2, the complex impedance curve N schematically shows the real axis component and the imaginary axis component of the complex impedance plotted on a two-dimensional plane. The frequency of the AC voltage (or AC current) applied to the battery module 20 is varied, and the complex impedance curve N is measured for each frequency.

In FIG. 2, the horizontal axis represents the absolute value of the real axis component Zreal (|Zreal|), and the vertical axis represents the absolute value of the imaginary axis component Zimg (|Zimg|).

The complex impedance curve N is divided from the low-frequency side into a component liquid resistance region A, an arcuate electric charge movement resistance region B, and a substantially straight diffusion resistance region C. The component liquid resistance region A is a region affected by contact resistance in an active material or an electric collector and by a resistance or the like when ions move in an electrolytic solution inside a separator. The electric charge movement resistance region B is a region affected by movement or the like of electric charges. The diffusion resistance region C is a region affected by impedance related to material diffusion.

The measurement frequency band includes a frequency range corresponding to the diffusion resistance region C. Impedance changes produced by a positive electrode capacity shift or a negative electrode capacity shift in the battery module 20 are more outstanding in the diffusion resistance region C than the other regions A and B. When determining whether or not a positive electrode capacity shift or a negative electrode capacity shift is occurring, AC voltage or AC current of at least the measurement frequency band is applied to the battery module 20 to measure the complex impedance of the battery module 20.

Actions

Figure 5:
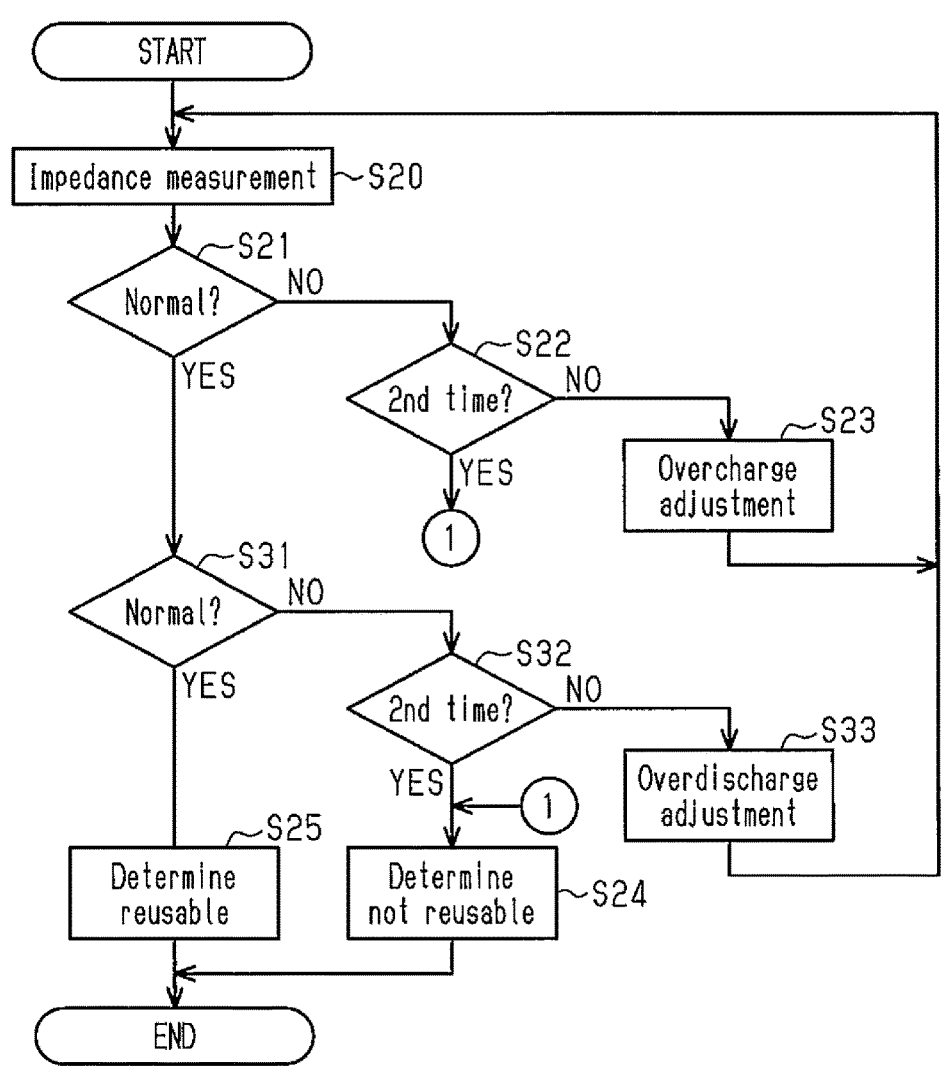
FIG. 5 is a flowchart illustrating determination procedures of deterioration modes in the determination method of the embodiment.

A method for reusing the battery module 20 will now be described with reference to FIGS. 3 to 5. FIG. 3 shows the procedures for reconfiguring a battery pack. A battery pack is reconfigured by selecting a reusable battery module 20 from used battery packs and configuring a new battery pack with the selected battery module 20. FIG. 4 shows conditions or the like used to determine whether or not to reuse the battery module 20. FIG. 5 shows the procedures for determining whether or not to reuse the battery module 20.

As shown in FIG. 3, a process for reconfiguring a battery includes a pack disassembling step (step S11) and a remainder discharging step (step S12). Further, the process for reconfiguring a battery pack includes a deterioration mode determination and adjustment step (step S13) and a pack assembling step (step S14).

In the pack disassembling step (step S11), a battery pack is disassembled to remove battery modules 20 from the battery pack. First, a used battery pack is collected from a vehicle, and the collected battery pack is disassembled to remove battery stacks. The removed battery stacks are mechanically and electrically disassembled to obtain a plurality of battery modules 20.

The remainder discharging step (step S12) discharges the battery module 20 obtained in the above step with the remainder discharge unit 121 until the remaining capacity decreases to a predetermined level. The predetermined remaining capacity (SOC) is, for example, "0 Ah" that is suitable for the measurement of the complex impedance. Thus, in the remainder discharging step, the battery module 20 is discharged by the discharge unit 11B so that the remaining capacity (SOC) becomes "0 Ah" (0%). Further, when adjusting the SOC of the battery module 20 to a value greater than 0%, the battery module 20 is first discharged to 0% and then charged by a predetermined amount.

The deterioration mode determination and adjustment step (step S13) determines the deterioration mode of the battery module 20 and adjusts the battery module 20 in correspondence with the deterioration mode. The deterioration mode determination and adjustment step may be performed a number of times. More specifically, once the battery module 20 is adjusted, the impedance may be subsequently measured again to check whether the adjustment was successful.

The deterioration mode is determined based on the complex impedance measured by the impedance measurement unit 11A.

As shown in table L5 of FIG. 4, deterioration modes include a mode in which a negative electrode capacity shift is occurring (row 51) and a mode in which a positive electrode capacity shift is occurring (row H52). A mode in which a negative electrode capacity shift is occurring (row H51) includes abnormal modes (row H511 and H512) and a normal mode that does not require adjustment (row H513). A mode in which a positive electrode capacity shift is occurring (row H52) includes abnormal modes (rows H521 and H522) and a normal mode that does not require adjustment (row H523).

The negative electrode capacity shift will now be described. As shown in FIG. 2, the value Fa of an imaginary axis component at a predetermined frequency is obtained as an absolute value of an imaginary axis component Zimg (|Zimg|) of the complex impedance curve N in the diffusion resistance region C. The predetermined frequency is set in a range of the measurement frequency band, preferably, the diffusion resistance region C in which the frequency is the lowest. The negative electrode capacity shift determination unit 123 determines a deterioration degree from the result of a comparison of the obtained value Fa of the predetermined frequency with "the negative electrode capacity shift large threshold value" serving as a first determination value and "the negative electrode capacity shift small threshold value" serving as a first determination value. In this case, the relationship of "the negative electrode capacity shift large threshold value">"the negative electrode capacity shift small threshold value" is satisfied. Further, in the diffusion resistance region C, as the value Fa of the predetermined frequency increases, the negative electrode capacity shift increases and the deterioration degree becomes higher. The negative electrode capacity shift determination unit 123 determines that the deterioration degree of the negative electrode capacity shift is "low" if the value Fa of the predetermined frequency is less than or equal to "the negative electrode capacity shift small threshold value" (row H513), "intermediate" if the value Fa of the predetermined frequency is greater than "the negative electrode capacity shift small threshold value" and less than "the negative electrode capacity shift large threshold value" (row H512), and "high" if the value Fa of the predetermined frequency is greater than or equal to "the negative electrode capacity shift large threshold value" (row H511).

The negative electrode capacity shift will now be described. As shown in FIG. 2, the gradient θk is obtained as a gradient with respect to an actual axis of the complex impedance curve N in the diffusion resistance region C. The positive electrode capacity shift determination unit 124 determines a deterioration degree from the result of a comparison of the obtained gradient θk with "the positive electrode capacity shift large threshold value" serving as a second determination value and "the positive electrode capacity shift small threshold value" serving as a second determination value. In this case, the relationship of "the positive electrode capacity shift large threshold value">"the positive electrode capacity shift small threshold value" is satisfied. Further, as the gradient θk decreases, the positive electrode capacity shift increases and the deterioration degree becomes higher. The positive electrode capacity shift determination unit 124 determines that the deterioration degree of the positive electrode capacity shift is "low" if the gradient θk is greater than or equal to "the positive electrode capacity shift small threshold value" (row H523), "intermediate" if the gradient θk is less than "the positive electrode capacity shift small threshold value" and greater than or equal to "the positive electrode capacity shift large threshold value" (row H522), and "high" if the gradient θk is less than "the positive electrode capacity shift large threshold value" (row H521).

The deterioration mode determination and adjustment step of step S13 will now be described with reference to FIG. 5. When the deterioration mode determination and adjustment step starts, the determination unit 120 obtains the complex impedance of the battery module 20 measured by the impedance measurement unit 11A with the impedance obtaining unit 122 and holds the obtained complex impedance in the memory 12A as the measurement data 12B (step S20).

Then, the determination unit 120 obtains the value Fa of the complex impedance at the predetermined frequency from the measurement data 12B with the negative electrode capacity shift determination unit 123 and determines whether or not the obtained value Fa of the complex impedance at the predetermined frequency is less than or equal to "the negative electrode capacity shift small threshold value" and normal and does not require adjustment (step S21). In other words, the determination unit 120 determines that a negative electrode capacity shift is occurring when the value Fa of the complex impedance at the predetermined frequency is greater than "the negative electrode capacity shift small threshold value" (first capacity shift determination step). In this case, when determining that the value Fa is abnormal and requires adjustment (NO in step S21), the determination unit 120 then determines whether or not abnormality has not been determined for the second time (step S22). When abnormality has not been determined for the second time (NO in step S22), the determination unit 120 performs overcharge adjustment as an overcharging step (step S23). The determination unit 120 sets the charging current and charging time for the overcharge adjustment in accordance with the deterioration degrees of "intermediate" and "high," which correspond to the negative electrode capacity shift. The determination unit 120 sets the charging current and the charging time to a first charging condition when the deterioration degree of the negative electrode capacity shift is "intermediate" and sets the charging current and the charging time to a second charging condition when the deterioration degree of the negative electrode capacity shift is "high." Further, the relationship of "'charging current×charging time' of first charging condition"<"'charging current×charging time' of second charging condition" is satisfied. Thus, as long as "the charging current" is the same, the relationship of "charging time of first charging condition"<"charging time of second charging condition" is satisfied. Further, the determination unit 120 charges the battery module 20 with the charge unit 11C based on the charging current and charging time set by the overcharge adjustment unit 126. When the overcharge adjustment is completed, the processing returns to the impedance measurement of step S20 and executes processing from step S20.

When an abnormality is determined for the second time or more (YES in step S22), the determination unit 120 determines with the reusability determination unit 125 that reuse is impossible (step S24). This ends the deterioration mode determination and adjustment step. Although not illustrated in the drawings, the processing procedures related to reconfiguration of the battery pack also end, and the battery module 20 that has undergone such a determination is designated as one that will not be reused.

When determined that the value Fa is normal and does not require adjustment (YES in step S21), the determination unit 120 determines with the positive electrode capacity shift determination unit 124 whether or not the gradient θk obtained from the measurement data 12B is greater than or equal to "the positive electrode capacity shift small threshold value" indicating that the gradient θk is normal and does not require adjustment (step S31). In other words, when the gradient θk is smaller than "the positive electrode capacity shift small threshold value," the determination unit 120 determines that a positive electrode capacity is occurring (second capacity shift determination step). When determining that the gradient θk is abnormal and requires adjustment (NO in step S31), the determination unit 120 determines whether or not abnormality has been determined for the second time (step S32). When determining that abnormality has not been determining for the second time (NO in step S32), the determination unit 120 performs overcharge adjustment as an overcharge adjustment step (step S33). The determination unit 120 sets the charge current and the charge time in overcharge adjustment in accordance with the deterioration degree. The determination unit 120 sets the charge current and the charge time to a first discharging condition when the deterioration degree of the positive electrode capacity shift is "intermediate" and sets the discharging current and the discharging time to a second discharging condition when the deterioration degree of the positive electrode capacity shift is "high." Further, the relationship of "'discharging current×discharging time' of first discharging condition"<"'discharging current×discharging time' of second discharging condition" is satisfied. Thus, as long as "the discharging current" is the same, the relationship of "discharging time of first discharging condition"<"discharging time of second discharging condition" is satisfied. Further, the determination unit 120 discharges the battery module 20 with the discharge unit 11B based on the discharging current and discharging time set by the overdischarge adjustment unit 127. When the overdischarge adjustment is completed, the processing returns to the impedance measurement of step S20 and executes processing from step S20.

When an abnormality is determined for the second time or more (YES in step S32), the determination unit 120 determines with the reusability determination unit 125 that reuse is impossible (step S24). This ends the deterioration mode determination and adjustment step. Although not illustrated in the drawings, the processing procedures related to reconfiguration of the battery pack also end, and the battery module 20 that has undergone such a determination is designated as one that will not be reused.

When determined that gradient θk is normal and does not require adjustment (YES in step S31), the determination unit 120 determines with the reusability determination unit 125 whether or not the battery module 20 is reusable (step S25). Then, the determination unit 120 ends the deterioration mode determination and adjustment step, continues the processing procedures related to reconfiguration of the battery pack, and designates the battery module 20 that has undergone such a determination as one that will not be reused.

A pack assembling step (step S14) assembles a new battery stack by electrically and mechanically combining a predetermined number of the battery modules 20 that have been selected as being reusable. This configures a battery pack with the battery modules 20 that have been selected as being reusable.

The battery module 20 undergoes the determination of whether or not the negative electrode capacity shift is normal two times. Further, overcharge adjustment (step S23) is performed at least once on the battery module 20 of which the negative electrode capacity shift has been determined as being abnormal. With the overcharge adjustment, the overcharging reduces the charge reserve amount so that the negative electrode capacity shift moves to the normal position relative to the positive electrode capacity. This reduces the negative electrode capacity shift and increases the possibility of the negative electrode capacity shift returning to a normal position. Thus, even when the negative electrode capacity shift of the battery module 20 is determined as being abnormal, the overcharge adjustment adjusts the charge reserve amount so that the negative electrode capacity shift is normal in the second determination. This increases the possibility that the battery module 20 will be reusable. That is, by correctly determining that the battery module 20 is in a state in which negative electrode capacity shift is occurring, the negative electrode capacity shift can be adjusted to reduce the negative electrode capacity shift of the battery module 20. Further, the adjustment for reducing the negative electrode capacity shift increases the reusability possibility of the battery module 20.

The determination of whether or not the positive electrode capacity shift of the battery module 20 is normal is performed two times. Further, with regard to a battery module 20 that has been determined as not being normal, the overdischarge adjustment (step S33) is performed at least once. When overdischarge adjustment is performed, overdischarging moves the relative position of the positive electrode capacity with respect to the negative electrode capacity to a normal position. This reduces the positive electrode capacity shift and increases the possibility of the positive electrode capacity shift returning to the normal range. Thus, even when the positive electrode capacity shift of the battery module 20 is determined as being normal, the overdischarge adjustment adjusts the position of the positive electrode capacity so that the positive electrode capacity shift is normal in the second determination. This increases the possibility that the battery module 20 will be reusable. That is, by correctly determining that the battery module 20 is in a state in which positive electrode capacity shift is occurring, the positive electrode capacity shift can be adjusted to reduce the positive electrode capacity shift of the battery module 20. Further, the adjustment for reducing the positive electrode capacity shift increases the reusability possibility of the battery module 20.

EXAMPLE 1

Figure 6:
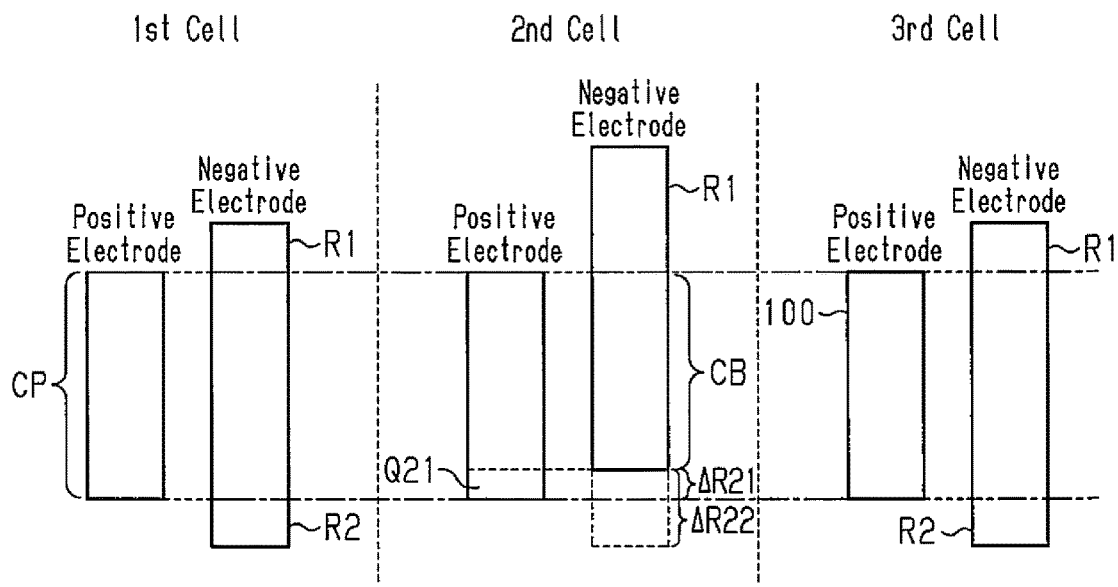
FIG. 6 is a schematic diagram illustrating the balance of the capacity of a positive electrode and the capacity of a negative electrode in a state in which negative electrode capacity shift is occurring.

With reference to FIG. 6, the battery capacity of each cell in the battery module 20 that is subject to determination will now be described. FIG. 1 exemplifies a case in which the battery module 20 includes six cells. However, for the sake of brevity, only three cells, namely, the first to third cells, will be described below.

FIG. 6 shows a case in which the capacity balance is normal for the positive electrode and the negative electrode in each of the first to third cells. The capacity of the negative electrode and the capacity of the positive electrode in a nickel-metal hydride battery are set so that the capacity of the negative electrode is larger than the capacity of the positive electrode. The negative electrode includes a charge reserve R1 that is the chargeable capacity when the remaining capacity of the positive electrode is the maximum (SOC 100%) so that the negative electrode absorbs oxygen during overcharging and the negative electrode does not generate hydrogen. Further, the negative electrode includes a discharge reserve R2 that is the dischargeable capacity when the remaining capacity of the positive electrode is "0" (SOC 0%) so that the battery capacity is not limited by the negative electrode during discharging. That is, the battery capacity CB of a nickel-metal hydride battery is restricted by the positive electrode and restricted by the capacity of the positive electrode. The term of "the remaining capacity of the positive electrode is the maximum" refers to a state in which the active material is free from non-charged portions.

In FIG. 6, the capacity balance of the positive electrode and the negative electrode in the second cell indicates the occurrence of a negative electrode capacity shift. The discharge reserve R2 decreases when the hydrogen of a hydrogen storage alloy, which is the negative electrode active material, is released from the battery case of the second cell. As the decrease in the discharge reserve R2 reaches the capacity ΔR22, the discharge reserve R2 becomes a "negative" capacity ΔR21 and the capacity balance of the cell is restricted by the negative electrode. When the capacity balance of at least one cell in the battery module 20 is restricted by the negative electrode, the discharge reserve Q21 of the positive electrode capacity cannot be used. This lowers the positive electrode capacity CP of each cell. Further, the negative electrode restriction of one cell results in negative electrode restriction of the entire battery module 20. Thus, the capacity corresponding to the discharge reserve Q21 in the range of the positive electrode capacity CP of each cell cannot be used. This reduces the battery capacity of the battery module 20.

The inventors have used the conventional selection method to distinguish and analyze battery modules 20. In the conventional selection method, when performing a determination based on the gradient θk of the complex impedance curve N, the occurrence of a capacity shift can be determined. However, there is no way to determine whether the capacity shift is a positive electrode capacity shift or a negative electrode capacity shift. Further, the value Fa of the complex impedance curve N at a certain frequency can only be used to determine a negative electrode capacity shift.

The inventors of the present invention have conducted research and found a technique to determine whether or not a battery module 20 includes a negative electrode capacity shift and whether or not the battery module 20 includes a positive electrode capacity shift. That is, the inventors have found that whether or not a negative electrode capacity shift is occurring in the battery module 20 can be determined from the value Fa of the complex impedance curve N at a certain frequency and whether or not a positive electrode capacity shift is occurring in the battery module 20 can be determined from the gradient θk of the complex impedance curve N in the diffusion resistance region C. Further, the inventors have found a technique for employing the deterioration mode determination and adjustment step shown in step S13 of FIG. 3.

For example, in the case of the battery module 20 shown in FIG. 6, in the second cell, the discharge reserve R2 from the negative electrode from the remaining capacity "0" of the positive electrode is the electrode capacity ΔR21 that is negative with respect to the remaining capacity "0" of the positive electrode. That is, a negative electrode capacity shift is occurring in the second cell because the discharge reserve R2 is lacking. The battery module 20 undergoes overcharge adjustment when determined for the first time that the negative electrode capacity is abnormal in the deterioration mode determination and adjustment step. In the first and third cells, the overcharge adjustment reduces the charge reserve R1 of the negative electrode while obtaining the discharge reserve R2. In this state, the charge reserve R1 of the second cell is decreased by the capacity ΔR21 to obtain the discharge reserve R2. Thus, the second cell is also set to positive electrode restriction in which the discharge reserve R2 is obtained when the positive electrode capacity is "0." In this manner, as long as the first to third cells are all set to positive electrode restriction, the battery capacity CB can be obtained in a state close to the initial capacity of the battery module 20.

EXAMPLE 2

The battery capacity of each cell in the battery module 20 that is subject to determination will now be described with reference to FIG. 7. In the same manner as FIG. 6, for the sake of brevity, only three cells, namely, the first to third cells, will be described below.

Figure 7:
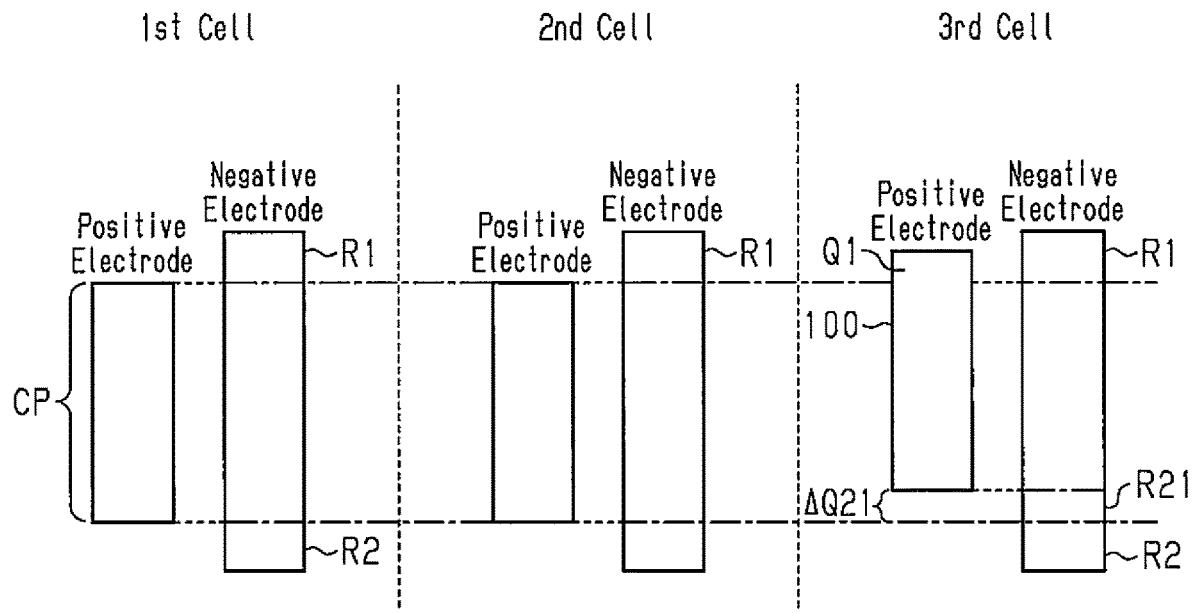
FIG. 7 is a schematic diagram illustrating the balance of the capacity of a positive electrode and the capacity of a negative electrode in a state in which positive electrode capacity shift is occurring.

FIG. 7 shows a case in which the capacity balance of the positive electrode and the negative electrode are normal in the first and second cells.

In FIG. 7, the positive electrode capacity has been changed because of reasons such as cobalt oxyhydroxide being reduced to cobalt hydroxide when repeating charging and discharging. More specifically, when the positive electrode capacity of the third cell is "0," the positive electrode capacity of each of the first and second cells is shifted capacity ΔQ21, which is greater than "0." When the positive electrode capacity of each of the first and second cells is "100%," the positive electrode capacity of the third cell is greater by capacity Q1 than "100%." Thus, in the battery module 20, charging of the first cell and the second cell to "100%" restricts charging, and discharging of the third cell to "0%" restricts discharging. More specifically, the battery capacity of the battery module 20 is decreased from the positive electrode capacity CP by "shifted capacity ΔQ21+ capacity Q1."

The inventors of the present invention have found that the occurrence of a positive electrode capacity shift in the battery module 20 can be determined based on the gradient θk of the complex impedance curve N in the diffusion resistance region C after determining a negative electrode capacity shift.

For example, in the battery module 20 shown in FIG. 7, the negative electrode of the third cell has "discharge reserve R2+capacity R21" with respect to the remaining capacity "0" of the positive electrode. Thus, as the battery module 20, the battery capacity is reduced by the capacity R21. When the positive electrode capacity shift is determined as being abnormal for the first time, overdischarge adjustment is performed on the battery module 20. The overdischarge adjustment eliminates charged active material from the positive electrode of each of the first to third cells. This reduces differences in the remaining capacity between the positive electrodes. Thus, for example, the value of "shifted capacity ΔQ21+capacity Q1" is decreased and the discharge capacity of the battery module 20 approaches the initial capacity. The hydrogen emitted to the outside during overdischarging is decomposed from an electrolytic solution. Thus, there is no direct effect on the hydrogen storage amount, and the capacity of the negative electrode is not adversely affected. Further, the timing at which overdischarging is completed is set based on when the SOC of the positive electrodes of the battery cells 21 included in the battery module 20 reaches 0%. This reduces the generation of hydrogen and prevents the electrolytic solution from becoming insufficient.

The advantages of this adjustment method are obtained when applied to a nickel metal-hydride battery. For example, when the adjustment method is applied to a nickel-cadmium rechargeable battery, the water molecules in the electrolytic solution are involved with the entire battery reaction and discharging will consume the water molecules. Thus, overdischarging will raise the concentration of the electrolytic solution. Further, in a nickel metal-hydride battery, overdischarging will result in oxidation reduction of the cadmium at the negative electrode causing dissolution and deposition. Further, the electrolytic solution is not involved with the battery reaction of the entire nickel-metal hydride battery, and the motor molecules in the electrolytic solution are involved only while discharging is performed. Thus, even if overdischarging is performed, the electrolytic solution does not become insufficient and increases are limited in the concentration of the solute in the electrolytic solution. Further, the hydrogen storage alloy of the negative electrode is neither dissolved nor deposited even when overcharging is performed. That is, a nickel metal-metal hydride rechargeable battery deteriorates less than other batteries when overcharging is performed. Thus, the demerits are small when applying the above method.

By decreasing the "shifted capacity ΔQ21+capacity Q1" of the positive electrode of the third cell, the same range is restricted by the positive electrode in the same manner as the other cells in the battery module 20. With regard to the first to third cells, as long as the range of positive electrode restriction is obtained at the same position, the battery capacity CB is obtained near the initial capacity of the battery module 20.

The present embodiment has the advantages described below.

(1) The determination of whether or not the battery module 20 includes a negative electrode capacity shift is based on the value of the complex impedance at a predetermined frequency. When the battery module 20 does not include a negative electrode capacity shift, the determination of whether or not a negative electrode capacity shift is occurring is based on the gradient θk of the real axis in the diffusion resistance region C of the complex impedance curve N. Thus, the battery module 20 can be determined as whether being in a state in which a negative electrode capacity shift is occurring, a state in which a positive electrode capacity shift is occurring, or a normal state in which a positive electrode capacity shift and a negative electrode capacity shift are both not occurring. This allows for further accurate determination of the state of the battery module 20.

(2) The occurrence of a negative electrode capacity shift in a rechargeable battery is determined based on whether the value of the complex impedance at a predetermined frequency is greater than "the negative electrode capacity shift small threshold value." Further, when the battery module 20 does not have a negative electrode capacity shift, the occurrence of a positive electrode capacity shift in the battery module 20 is determined based on whether the gradient of a real axis in the diffusion resistance region of the complex impedance curve is smaller than "the positive electrode capacity shift small threshold value." This allows the state of the battery module 20 to be easily determined.

(3) The level of the negative electrode capacity shift is determined. This is information useful for processing the negative electrode capacity shift.

(4) The level of the positive electrode capacity shift is determined. This is information useful for processing the positive electrode capacity shift.

(5) A battery module 20 in which negative electrode capacity shift is occurring undergoes overcharging to adjust the capacity shift. Thus, even when the battery module 20 is determined as having a negative electrode capacity shift, the negative electrode capacity shift can be adjusted. This increases the possibility of the battery module 20 being reusable.

(6) A battery module 20 in which positive electrode capacity shift is occurring undergoes overdischarging to adjust the capacity shift. Thus, even when the battery module 20 is determined as having a positive electrode capacity shift, the positive electrode capacity shift can be adjusted. This increases the possibility of the battery module 20 being reusable.

(7) The battery module 20 that has undergone negative electrode capacity shift adjustment undergoes a negative electrode capacity shift determination again. Thus, even when determined once that a negative electrode capacity shift is occurring in the battery module 20, the possibility of the battery module 20 determined as being usable is increased.

(8) The battery module 20 that has undergone positive electrode capacity shift adjustment undergoes a positive electrode capacity shift determination again. Thus, even when determined once that a positive electrode capacity shift is occurring in the battery module 20, the possibility of the battery module 20 determined as being usable is increased.

(9) A positive electrode capacity shift and a negative electrode capacity shift are each determined for a nickel metal-hydride rechargeable battery in which the positive electrode capacity and the negative electrode capacity normally have a positive electrode restriction relationship. Thus, the state of the nickel metal-hydride rechargeable battery is determined with further accuracy.

It should be apparent to those skilled in the art that the present invention may be embodied in many other specific forms without departing from the spirit or scope of the invention. Particularly, it should be understood that the present invention may be embodied in the following forms.

In the case exemplified in the above embodiment, the remaining capacity of "0 Ah" or SOC "0%" is suitable for complex impedance measurement. However, as long as the remaining capacity of rechargeable battery is small, the remaining capacity does not have to be "0 Ah" and the SOC does not have to be "0%." Further, after the SOC of the battery module 20 is set to "0%," a predetermined amount can be charged so that the SOC is a value other than "0%."

The above embodiment exemplifies a case in which the battery module 20 includes six cells. However, the number of cells may be greater than or less than six.

For example, the battery module may be a unit cell including a single battery cell. A negative electrode capacity shift and a positive electrode capacity shift can also be determined for such a unit cell.

Figures 8A, 8B:
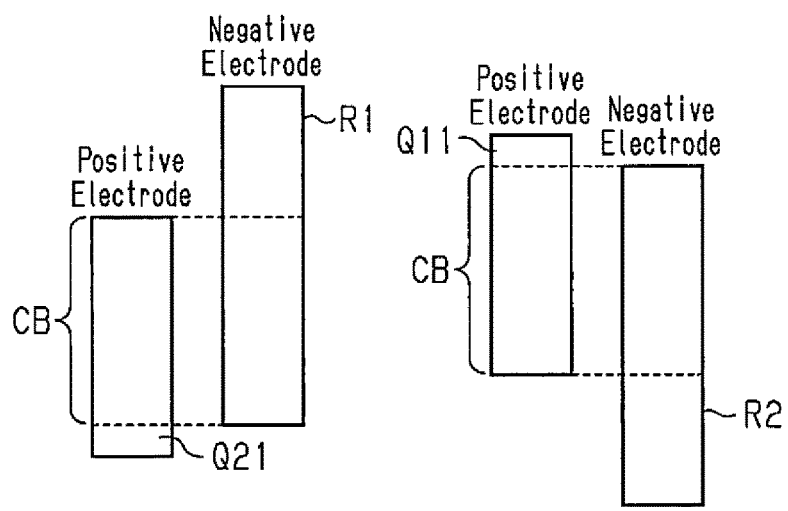

For example, FIG. 8A shows the relationship of the negative electrode capacity and the positive electrode capacity of a unit cell in which a negative capacity shift is occurring. The negative electrode includes the charge reserve R1 during charging. However, the negative electrode does not include a discharge reserve during discharging, and the positive electrode includes the discharge reserve Q21 that is lower than the battery capacity of the negative electrode. In this case, the negative electrode capacity relatively moves toward the side where the positive electrode capacity is high. Thus, there is no discharge reserve at the negative electrode, and negative electrode restriction occurs during discharging. As a result, the battery capacity becomes the battery capacity CB that is smaller than the positive electrode capacity. The deterioration mode determination and adjustment step can determine a negative electrode capacity shift even for such a battery. Further, the unit cell can be reconditioned through overcharge adjustment, and negative electrode capacity shift can be determined again after the reconditioning process.

For example, FIG. 8B shows the relationship of the negative electrode capacity and the positive electrode capacity of a unit cell in which a positive electrode capacity shift is occurring. The negative electrode includes the discharge reserve R2 during discharging. However, the negative electrode does not include a charge reserve during charging, and the positive electrode includes a charge reserve Q11 that is greater than the battery capacity of the negative electrode. In this case, the positive electrode capacity relatively moves toward the side where the negative electrode capacity is high. Thus, there is no charge reserve at the negative electrode, and negative electrode restriction occurs during charging. As a result, the battery capacity becomes the battery capacity CB that is smaller than the positive electrode capacity. The deterioration mode determination and adjustment step can determine a negative electrode capacity shift even for such a battery. Further, the unit cell can be reconditioned through overdischarge adjustment, and negative electrode capacity shift can be determined again after the reconditioning process.

The above embodiment exemplifies a case in which the discharge current and discharge time in overdischarge adjustment are set in accordance with the deterioration degrees of "intermediate" and "high." Instead, the discharge current and the discharge time can be set in accordance with only one deterioration degree or in accordance with finer deterioration degrees. Further, the discharge current and the discharge time can be set regardless of the deterioration degree during overdischarge adjustment. For example, a single discharge current and a single discharge time can be set. As long as overdischarge adjustment is performed on the same type of battery module, even when only one discharge current and one discharge time is set, the probability that the battery model will be suitably adjusted is high.

The above embodiment exemplifies a case in which the charge current and charge time in overcharge adjustment are set in accordance with the deterioration degree. Instead, the charge current and the charge time can be set in accordance with only one deterioration degree or in accordance with finer deterioration degrees. Further, the charge current and the charge time can be set regardless of the deterioration degree during overcharge adjustment. For example, a single charge current and a single charge time can be set. As long as overcharge adjustment is performed on the same type of battery module, even when only one charge current and one charge time is set, the probability that the battery model will be suitably adjusted is high.

The above embodiment exemplifies a case in which the battery module 20 is a nickel metal-hydride rechargeable battery. However, the rechargeable battery may be a nickel-cadmium rechargeable battery or a lithium-ion rechargeable battery.

The above embodiment exemplifies a case in which the battery module 20 of which the positive electrode capacity has been determined as being abnormal undergoes overdischarge adjustment and then undergoes determination again of whether or not the positive electrode capacity shift is normal. However, it is only required that the positive electrode capacity shift of the battery module be indicated as being greater than specified. This also allows the battery state of the battery module to be properly recognized. Thus, by performing overdischarge adjustment afterward, the reusability of the battery module is increased.

The above embodiment exemplifies a case in which the determination of a positive electrode capacity shift is performed two times. Instead, the determination of a positive electrode capacity shift may be performed two times or more. This allows for further accurate determination of a reusable battery.

The above embodiment exemplifies a case in which the battery module 20 of which the negative electrode capacity shift has been determined as being abnormal undergoes overcharge adjustment and then undergoes determination again of whether or not the negative electrode capacity shift is normal. However, it is only required that the negative electrode capacity shift of the battery module be indicated as being greater than specified. This also allows the battery state of the battery module to be properly recognized. Thus, by performing overcharge adjustment afterward, the reusability of the battery module is increased.

The above embodiment exemplifies a case in which the determination of the negative electrode capacity shift is performed up to two times. Instead, the negative electrode capacity shift can be determined two times or more. This allows for further accurate determination of a reusable battery.

The above embodiment includes an overdischarge adjustment process but does not have to include the overdischarge adjustment process. As long as a positive electrode capacity shift can be determined, overdischarge adjustment can be performed separately.

The above embodiment includes an overcharge adjustment process but does not have to include the overcharge adjustment process. As long as a negative electrode capacity shift can be determined, overcharge adjustment can be performed separately.

The above embodiment exemplifies a case in which determination values are a threshold value for determining whether or not a negative electrode capacity shift is occurring and a threshold value for determining whether or not a positive electrode capacity shift is occurring. Instead, the determination value may be a value indicating that a negative electrode capacity shift is not occurring or a value indicating that a positive electrode capacity shift is not occurring.

When the determination value is a value indicating that there is no negative electrode capacity shift or a value indicating that there is no positive electrode capacity shift, the negative electrode capacity shift determination unit may determine that a negative electrode capacity shift is occurring when the difference between the value Fa of the complex impedance at a predetermined frequency and a first determination value serving as a value indicating that there is no negative electrode capacity shift is greater than a predetermined value. Further, the positive electrode capacity shift determination unit may determine that a positive electrode capacity shift is occurring when the difference between the gradient θk of the real axis in the diffusion resistance region of the complex impedance curve and a second determination value serving as a value indicating that there is no positive electrode capacity shift is greater than a predetermined value.

As one example of a determination value serving as a value indicating that there is no negative electrode capacity shift or a value indicating that there is no positive electrode capacity shift, the value of a normal battery may be obtained as a determination value, and a determination may be made based in a difference from the determination value.

The difference between the value Fa at a predetermined frequency and the first determination value may be set in advance based on experiments and experience or as a logical value. In the same manner, the difference between the gradient θk and the second determination value may be set in advance based on experiments and experience or as a logical value.

The above embodiment exemplifies a case in which two threshold values are compared with a positive electrode capacity shift. Instead, the number of threshold values compared with a positive electrode capacity shift may be one or three or more. When there is one threshold value, the calculation load is decreased. When there are three or more threshold values, the positive electrode capacity shift (deterioration) can be finely classified.

The above embodiment exemplifies a case in which two threshold values are compared with a negative electrode capacity shift. Instead, the number of threshold values compared with a negative electrode capacity shift may be one or three or more. When there is one threshold value, the calculation load is decreased. When there are three or more threshold values, the negative electrode capacity shift (deterioration) can be finely classified.

In the above embodiment, the occurrence of a negative electrode capacity shift is determined when the value of the complex impedance at a predetermined frequency is greater than a threshold value. Instead, the non-occurrence of a negative electrode capacity shift may be determined when the value of the complex impedance at a predetermined frequency is less than or equal to the threshold value.

Further, the occurrence of a positive electrode capacity shift is determined when the gradient of a real axis in the diffusion resistance region of the complex impedance is greater than a threshold value. Instead, the non-occurrence of a positive electrode capacity shift may be determined when the gradient of a real axis in the diffusion resistance region of the complex impedance is less than or equal to a threshold value.

In the above embodiment, the value Fa of an imaginary axis component of the complex impedance at a predetermined frequency is used to determine whether or not a negative electrode capacity shift is occurring. Instead, the level of a value of an actual axis component of the complex impedance at a predetermined frequency or the level of the complex impedance may be used to determine whether or not a negative electrode capacity shift is occurring.

The above embodiment exemplifies a case in which the value Fa of the complex impedance at a predetermined frequency is in the diffusion resistance region C. Instead, the value at a predetermined frequency may be the level of the component liquid resistance region A or the electric charge movement resistance region B. The value at a predetermined frequency in the component liquid resistance region A or the electric charge movement resistance region B is greatly affected by a battery state other than the negative electrode capacity shift. Thus, other battery states may be taken into account to further accurately determine a battery electrode capacity shift. For example, the component liquid resistance region A and the electric charge movement resistance region B have a high measurement frequency and measurements can be performed within a short period of time. Thus, the component liquid resistance region A or the electric charge movement resistance region B is first measured. When a negative electrode capacity shift cannot be properly determined, a determination may be made based on the measurement of the diffusion resistance region C.

The present examples and embodiments are to be considered as illustrative and not restrictive, and the invention is not to be limited to the details given herein, but may be modified within the scope and equivalence of the appended claims.

The invention claimed is:

1. A method for determining a state of a rechargeable battery, the method comprising:
   obtaining a complex impedance measured by applying AC voltage or AC current to a rechargeable battery that is subject to determination; and
   determining a state of the rechargeable battery based on the obtained complex impedance, wherein the determining a state of the rechargeable battery includes
      determining whether or not a first capacity shift is occurring based on a comparison of a value of the complex impedance at a predetermined frequency with a first determination value used to determine a negative electrode capacity shift, and
      when determined that the first capacity shift is not occurring, determining whether or not a second capacity shift is occurring based on a comparison of a gradient of the complex impedance with respect to a real axis in a diffusion resistance region with a second determination value used to determine a positive electrode capacity shift.

2. The method according to claim 1, wherein
   the first determination value is a threshold value used to determine that the first capacity shift is occurring,
   the determining whether or not a first capacity shift is occurring includes determining that the first capacity shift is occurring when the value of the complex impedance at the predetermined frequency is greater than the first determination value,
   the second determination value is a threshold value used to determine that the second capacity shift is occurring, and
   the determining whether or not a second capacity shift is occurring includes determining that the second capacity shift is occurring when the gradient of the complex impedance with respect to the real axis in the diffusion resistance region is less than the second determination value.

3. The method according to claim 2, wherein
   the first determination value is one of a plurality of first determination values that differ from each other;
   the determining whether or not a first capacity shift is occurring includes determining an amount of the first capacity shift based on a comparison of the value of the complex impedance at the predetermined frequency with the plurality of first determination values.

4. The method according to claim 1, wherein
the second determination value is one of a plurality of second determination values that differ from each other;
the determining whether or not a second capacity shift is occurring includes determining an amount of the second capacity shift based on a comparison of the gradient of the complex impedance with respect to the real axis in the diffusion resistance region with the plurality of second determination values.

5. The method according to claim 1, wherein
the first determination value is a value indicating that the first capacity shift is not occurring,
the determining whether or not a first capacity shift is occurring includes determining that the first capacity shift is occurring when a difference of the value of the complex impedance at the predetermined frequency and the first determination value is greater than a predetermined value,
the second determination value is a value indicating that the second capacity shift is not occurring, and
the determining whether or not a second capacity shift is occurring includes determining that the second capacity shift is occurring when a difference of the gradient of the complex impedance with respect to the real axis in the diffusion resistance region and the second determination value is greater than a predetermined value.

6. The method according to claim 1, further comprising overcharging the rechargeable battery when determined that the first capacity shift is occurring.

7. The method according to claim 1, further comprising overdischarging the rechargeable battery when determined that the second capacity shift is occurring.

8. The method according to claim 6, further comprising:
re-determining whether or not the first capacity shift is occurring in the overcharged rechargeable battery, and
determining that the rechargeable battery is not reusable when re-determined that the first capacity shift is occurring.

9. The method according to claim 7, further comprising:
re-determining whether or not the second capacity shift is occurring in the overdischarged rechargeable battery, and
determining that the rechargeable battery is not reusable when re-determined that the second capacity shift is occurring.

10. The method according to claim 1, wherein the rechargeable battery is a nickel-metal hydride rechargeable battery.

11. A state determination device for a rechargeable battery, the state determination device comprising:
an impedance obtaining unit configured to obtain a complex impedance measured by applying AC voltage or AC current to a rechargeable battery that is subject to determination; and
a state determination unit configured to determine a state of the rechargeable battery based on the complex impedance obtained by the impedance obtaining unit, wherein the state determination unit includes a first capacity shift determination unit configured to determine whether or not a first capacity shift is occurring based on a comparison of a value of the complex impedance at a predetermined frequency with a first determination value used to determine a negative electrode capacity shift, and
a second capacity shift determination unit configured to determine, when the first capacity shift determination unit determines that the first capacity shift is not occurring in the rechargeable battery, whether or not a second capacity shift is occurring based on a comparison of a gradient of the complex impedance with respect to a real axis in a diffusion resistance region with a second determination value used to determine a positive electrode capacity shift.

12. The state determination device according to claim 11, wherein
the first determination value is a threshold value used to determine that the first capacity shift is occurring,
the first capacity shift determination unit is configured to determine that the first capacity shift is occurring when the value of the complex impedance at the predetermined frequency is greater than the first determination value,
the second determination value is a threshold value used to determine that the second capacity shift is occurring, and
the second capacity shift determination unit is configured to determine that the second capacity shift is occurring when the gradient of the complex impedance with respect to the real axis in the diffusion resistance region is less than the second determination value.

13. The state determination device according to claim 11, wherein
the first determination value is a value indicating that the first capacity shift is not occurring,
the first capacity shift determination unit is configured to determine that the first capacity shift is occurring when a difference of the value of the complex impedance at the predetermined frequency and the first determination value is greater than a predetermined value,
the second determination value is a value indicating that the second capacity shift is not occurring, and
the second capacity shift determination unit determines that the second capacity shift is occurring when a difference of the gradient of the complex impedance with respect to the real axis in the diffusion resistance region and the second determination value is greater than a predetermined value.

14. The state determination device according to claim 11, further comprising an overcharging unit that overcharges the rechargeable battery when the first capacity shift determination unit determines that the first capacity shift is occurring.

15. The state determination device according to claim 11, further comprising an overdischarging unit that overdischarges the rechargeable battery when the second capacity shift determination unit determines that the second capacity shift is occurring.

* * * * *